United States Patent
Huang et al.

(10) Patent No.: US 7,231,618 B2
(45) Date of Patent: Jun. 12, 2007

(54) FRINGE RLGC MODEL FOR INTERCONNECT PARASITIC EXTRACTION

(75) Inventors: Ching-Chao Huang, San Jose, CA (US); Clement Kam Lam Luk, Milpitas, CA (US)

(73) Assignee: Optimal Corporation, San Jose, CA (US)

( * ) Notice: Subject to any disclaimer, the term of this patent is extended or adjusted under 35 U.S.C. 154(b) by 432 days.

(21) Appl. No.: 10/829,698

(22) Filed: Apr. 22, 2004

(65) Prior Publication Data

US 2005/0240883 A1 Oct. 27, 2005

(51) Int. Cl.
*G06F 17/50* (2006.01)
(52) U.S. Cl. .......................................... 716/4; 703/13
(58) Field of Classification Search ............... 716/1–4, 716/6; 703/13–14
See application file for complete search history.

(56) References Cited

U.S. PATENT DOCUMENTS

| | | | | |
|---|---|---|---|---|
| 6,175,947 | B1 | 1/2001 | Ponnapalli et al. | 716/5 |
| 6,185,722 | B1 | 2/2001 | Darden et al. | 716/5 |
| 6,243,653 | B1 | 6/2001 | Findley | 702/65 |
| 6,421,814 | B1 * | 7/2002 | Ho | 716/5 |
| 6,438,729 | B1 | 8/2002 | Ho | 716/1 |
| 6,449,754 | B1 | 9/2002 | You et al. | 716/5 |
| 6,643,831 | B2 | 11/2003 | Chang et al. | 716/4 |

OTHER PUBLICATIONS

Pascal Jean Frey and Paul-Louis George, *Mesh Generation: Application to Finite Elements*, Hermes Science Publishing, Oxford, United Kingdom (2000), pp. 116-119.

Albertus J. Kemp, Jacobus A. Pretorius, and Willem Smit, The Generation of a Mesh for Resistance Calculation in Integrated Circuits, *IEEE Transactions on Computer-Aided Design*, vol. 7, No. 10, Oct. 1988, pp. 1029-1037.

Joong-Ho Kim and Madhavan Swaminathan, "Modeling of Irregular Shaped Power Distribution Planes Using Transmission Matrix Method," *IEEE Transactions on Advanced Packaging*, vol. 24, No. 3, Aug. 2001, pp. 334-346.

Joong-Ho Kim and Madhavan Swaminathan, "Modeling of Multilayered Power Distribution Planes Using Transmission Matrix Method," *IEEE Transactions on Advanced Packaging*, vol. 25, No. 2, May 2002 pp. 189-199.

Henry Hungjen Wu, Jeffrey W. Meyer, Keunmyung Lee, and Alan Barber, Accurate Power Supply and Ground Plane Pair Models, *IEEE Transactions on Advanced Packaging*, vol. 22, No. 3, Aug. 1999, pp. 259-266.

J. Eric Bracken, Din-Kow Sun, and Zoltan J. Cendes, "S-Domain Methods for Simultaneous TIme and Frequency Characterization of Electromagnetic Devices," *IEEE Transactions on Microwave Theory and Techniques*, vol. 46, No. 9, Sep. 1998, pp. 1277-1290.

* cited by examiner

*Primary Examiner*—Stacy A Whitmore
(74) *Attorney, Agent, or Firm*—Victor H. Okumoto

(57) ABSTRACT

An RLGC library is generated so as to include fringe RLCG functions for 2-D canonical interconnect structures. During parameter extraction for selected interconnect structures of an integrated circuit, printed circuit board, or integrated circuit package design, the RLGC library is used to generate fringe RLGC coefficients which in addition to area RLGC coefficients calculated on-the-fly, are used to generate equivalent RLGC circuits or S-parameters for simulating the interconnect structures.

24 Claims, 12 Drawing Sheets

FRINGE RLGC MODEL FOR INTERCONNECT PARASITIC EXTRACTION

FIELD OF THE INVENTION

The present invention generally relates to models for interconnect parasitic extraction and in particular, to a fringe RLGC model for interconnect parasitic extraction.

BACKGROUND OF THE INVENTION

Interconnect parasitic extraction is useful for analyzing signal propagation characteristics such as impedance mismatch and timing delays, as well as ground bounce in power distribution systems. The extraction of highly accurate interconnect parasitics, however, is difficult for many complex interconnect structures such as found in integrated circuits, electronic packages, and printed circuit boards, because of excessive processor and memory requirements.

For example, although three-dimensional ("3-D") full-wave field solvers are known to provide high accuracy in calculating interconnect parasistics, less accurate two-dimensional ("2-D") field solvers are generally employed in the design process to reduce processor and memory requirements to practical levels.

To further reduce parasitic extraction time during the design verification phase, a library of pre-computed RLGC (resistance "R", inductance "L", conductance "G", capacitance "C") functions for a number of 2-D canonical interconnect structures may be provided. When a 2-D cross-section of an interconnect matches that of a canonical structure in the library, the pre-computed information stored in the library can be used to quickly calculate RLGC coefficients for the interconnect.

Interconnect parasitics can be classified as being either area, lateral or fringe parasistics. Area parasistics involve interactions between top and bottom surfaces of two conductive elements disposed vertically with respect to each other. Lateral parasitics involve interactions between opposing side surfaces of two conductive elements disposed horizontally with respect to each other. Fringe parasitics involve interactions between side surfaces of one conductive element and a top (or bottom) surface of another conductive element disposed below (or above) it.

Various models for interconnect parasitic extraction have been used for generating an equivalent circuit or transmission line for simulating an interconnect. One RC model uses area resistance ("Ra") and area capacitance ("Ca") coefficients for generating an equivalent RC circuit. Another RC model uses fringe capacitance ("Cf") as well as the area resistance ("Ra") and area capacitance ("Ca") coefficients. An RLC model, on the other hand, uses an area inductance ("La") as well as the area resistance ("Ra"), area capacitance ("Ca"), and fringe capacitance ("Cf") coefficients for generating an equivalent RLC circuit for simulating the interconnect.

None of these approaches, however, succeeds in extracting interconnect parasitic coefficients that accurately simulate interconnect frequency response over a wide range of operation like a 3-D full wave field solver does.

OBJECTS AND SUMMARY OF THE INVENTION

An accurate model for interconnect parasitic extraction is highly desirable so that its corresponding equivalent circuit or transmission line accurately simulates an interconnect. Accurate simulation of design interconnect structures is especially important where signal timing is critical for correct operation. Accurate simulation is also important where costly and time consuming redesign can be avoided. Avoiding redesign in this case is especially valuable where re-tooling costs are high, redesign and/or manufacturing time is lengthy, and product life cycles are short so that time to market is crucial.

Accordingly, one object of the present invention is to provide a model for interconnect parasitic extraction that provide parasitic coefficients that accurately simulate interconnect frequency response over a wide range of operation comparable to results achieved using a 3-D full-wave field solver approach.

Another object is to provide a model for interconnect parasitic extraction that provides parasitic coefficients that accurately simulate interconnect frequency response over a wide range of operation that uses processor and memory resources comparable to 2-D field solvers models.

Another object is to provide a Resistance, Inductance, Conductance, Capacitance ("RLGC") library utilizing such a model for generating RLGC coefficients that define an equivalent RLGC circuit or a set of S-parameters that accurately simulates an interconnect.

Still another object is to provide a method for generating RLGC coefficients that define an equivalent RLGC circuit or a set of S-parameters that accurately simulates an interconnect and is suitable for irregularly shaped interconnect structures.

These and other objects are accomplished by the various aspects of the present invention, wherein briefly stated, one aspect is a method for generating an RLGC library, comprising: generating a total inductance function for a canonical interconnect structure; generating a fringe inductance function using the total inductance function; and storing the fringe inductance function in an RLGC library.

Another aspect is a method for generating an RLGC library, comprising: generating a total resistance function for a canonical interconnect structure; generating a fringe resistance function using the total resistance function; and storing the fringe resistance function in an RLGC library.

Still another aspect is a method for generating an RLGC library, comprising: generating a total conductance function for a canonical interconnect structure; generating a fringe conductance function using the total conductance function; and storing the fringe conductance function in an RLGC library.

Yet another aspect is a method for generating resistance, inductance, conductance, capacitance ("RLGC") coefficients of an equivalent circuit for simulating an interconnect structure, comprising: defining a plurality of meshes on a surface of an interconnect structure; calculating at least one area RLGC coefficient for each of the plurality of meshes; and calculating at least one fringe RLGC coefficient for each mesh of the plurality of meshes that has an outer edge that does not abut an edge of another mesh of the plurality of meshes.

Additional objects, features and advantages of the various aspects of the present invention will become apparent from the following description of its preferred embodiment, which description should be taken in conjunction with the accompanying drawings.

DETAILED DESCRIPTION OF THE PREFERRED EMBODIMENT

A fringe RLGC model is described herein whose various aspects meet the objectives stated above.

Figure 1:
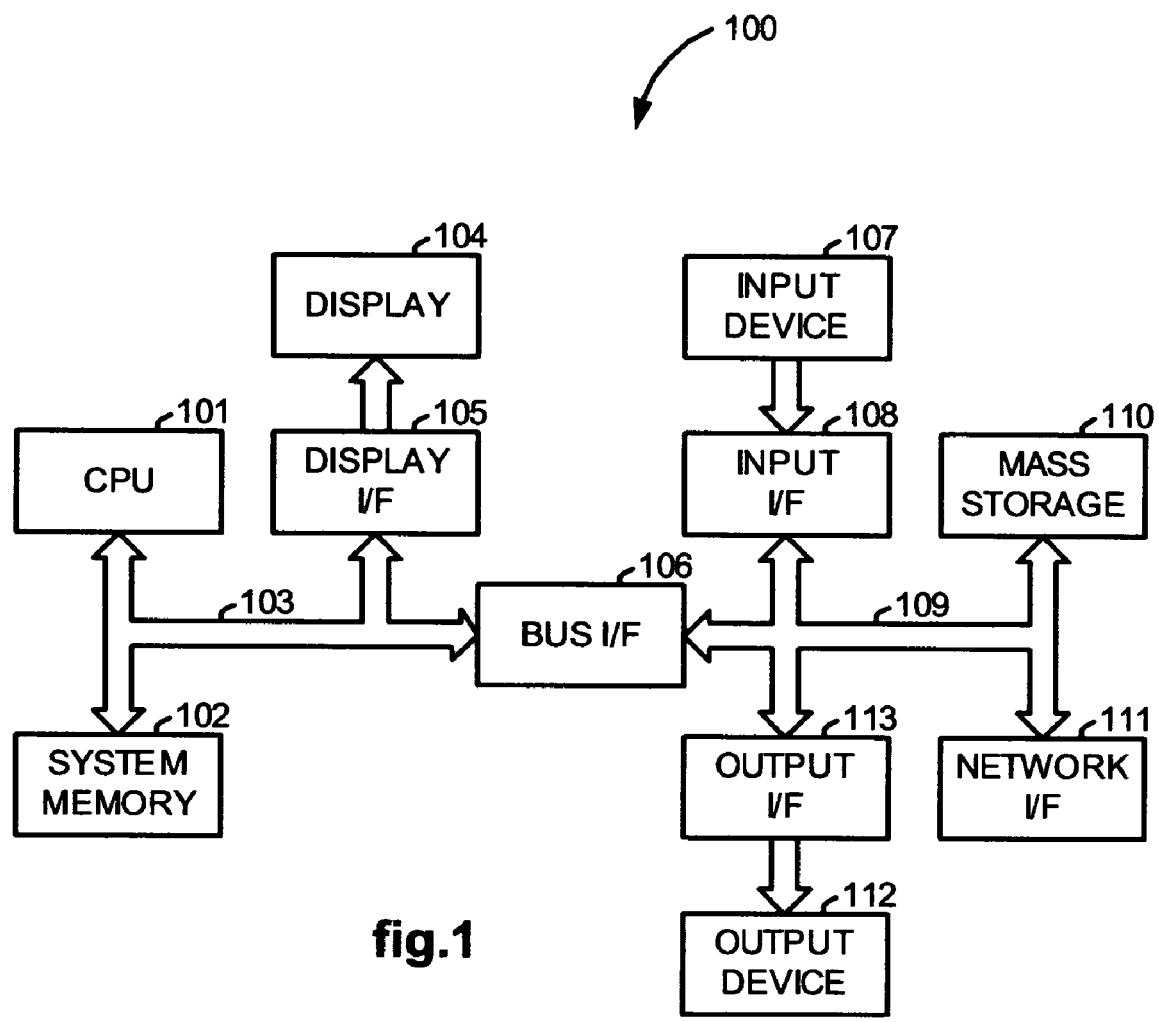
FIG. 1 illustrates a block diagram of a computer system implementing aspects of the present invention.

FIG. 1 illustrates, as an example, a block diagram of a computer system 100 configured to implement the various methods described herein that are applicable to designing an integrated circuit, printed circuit board, integrated circuit package, or other device including interconnects for transmitting electrical signals. Included in the computer system 100 are a central processing unit (CPU) 101 such as those typically employed with personal computers or engineering work stations, system memory 102 such as solid state memory, mass storage 110 such as one or more hard disk drive units, and a number of input and output devices for user interaction with the computer system 100.

Input devices (represented by input device 107) include conventional items such as a keyboard and a user manipulated pointing device such as a mouse. Output devices include a display 104 such as a cathode ray tube (CRT) or liquid crystal display (LCD) display screen, as well as other conventional output devices (represented by output device 112) such as a printer or a plotter. Also preferably included in the computer system 100 is a network interface card 111 for communicating with other computers coupled through a network such as a local area network (LAN) or the Internet.

The computer system 100 also includes cooperative software programs and databases for design verification. In addition to programs to implement the various methods described herein, the computer system 100 includes (or is configured with) software programs such as a 2-D field solver, a 3-D geometric model generator that generates a 3-D model of a design from physical and process design data, a 2-D cross-section generator, a pattern matcher (for matching interconnect 2-D cross-sections with 2-D canonical interconnect structures), a mesh generator, a circuit solver, and a S-parameter generator. Databases include such items as a computer-aided design ("CAD") data file storing physical design information, a technology file storing manufacturing process information, and an RLGC library. Further details on such software programs and databases are described in the following methods.

Figure 2:
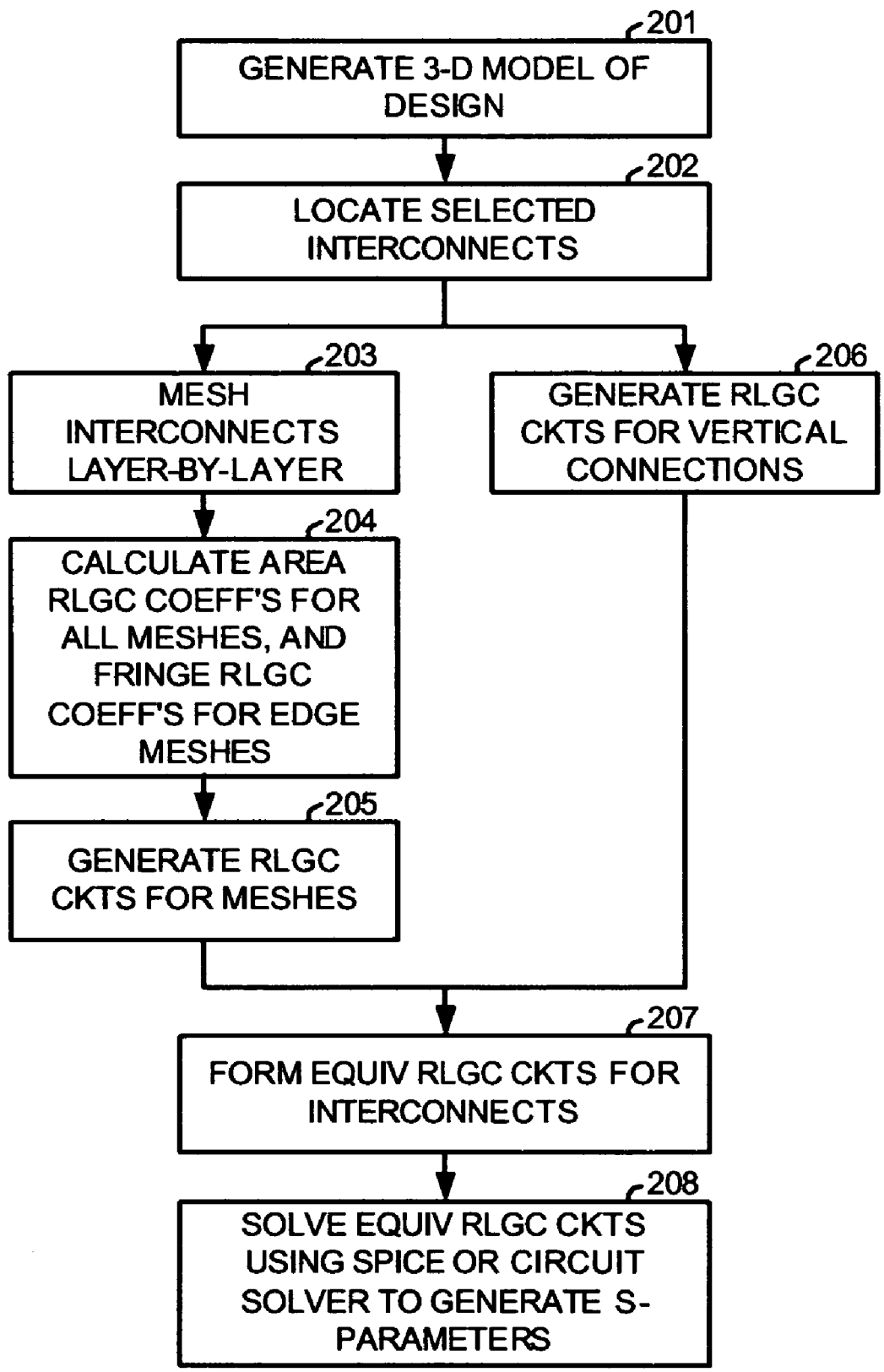
FIG. 2 illustrates a flow diagram of a method for generating equivalent RLGC circuits and S-Parameters for simulating selected interconnects, utilizing aspects of the present invention.

FIG. 2 illustrates, as an example, a flow diagram of a method for generating equivalent RLGC circuits for simulating selected interconnects. In 201, a 3-D model of a design is generated by the 3-D geometric model generator from CAD data that specifies the layout of the design (such as a GDS-II, MCM, or Gerber file), and a technology file providing process information used in fabricating the design (such as conductivities, dielectric constants, permeability values, and loss tangents). In 202, the selected interconnect structures in the 3-D model of the design are identified for processing. Selection in this case may be by interactive user input or from information stored in a previously generated file.

In 203, each of the interconnect structures is conventionally meshed such as described, for example, in Pascal Jean Frey and Paul-Louis George, *Mesh Generation: Application to Finite Elements*, Hermes Science Publishing, Oxford, United Kingdom, pp. 116-119; or Albertus J. Kemp, Jacobus A. Pretorius, and Willem Smit, "The Generation of a Mesh for Resistance Calculation in Integrated Circuits," *IEEE Transactions on Computer-Aided Design*, Vol. 7, No. 10, October 1988, pp. 1029-1037.

For multi-layered interconnect structures, such meshing is performed on each layer using a layer-by-layer procedure.

Figure 10:
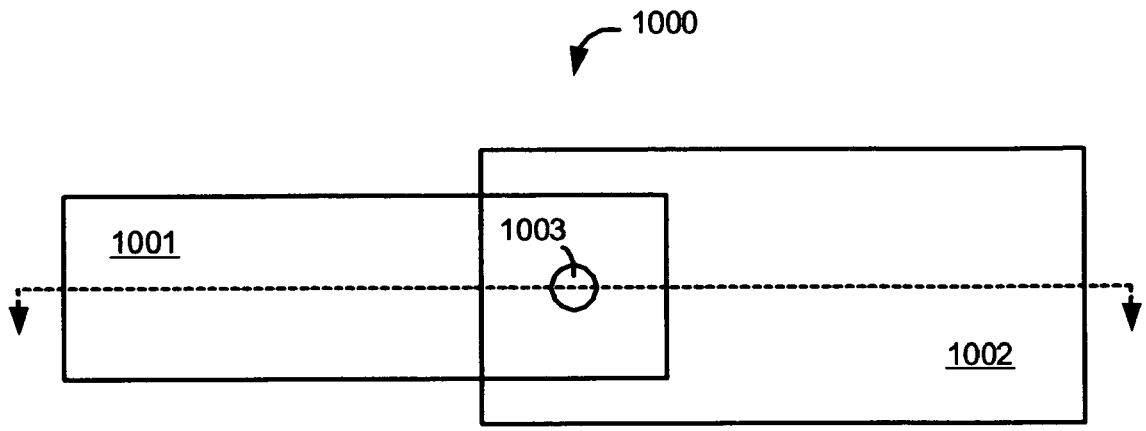
FIG. 10 illustrates a top plan view of a two-layer interconnect structure.
Figure 11:
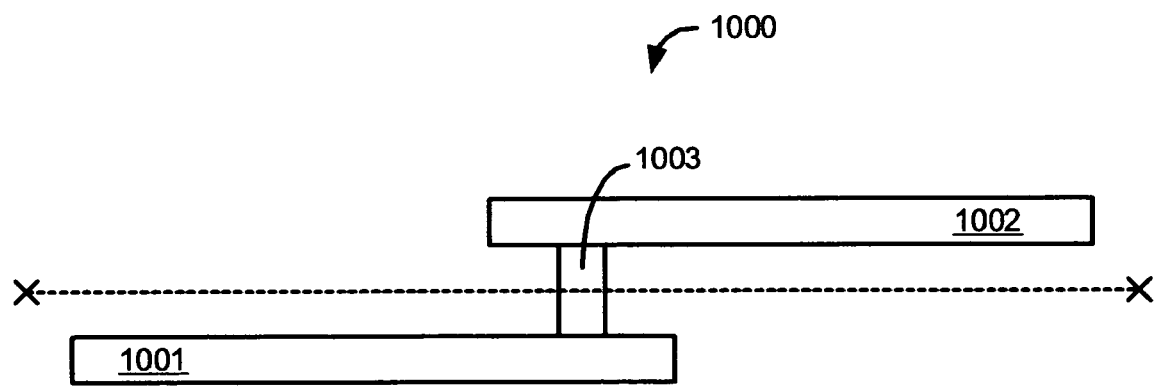
FIG. 11 illustrates a front cross-sectional view of the two-layer interconnect structure of FIG. 10.

For example, referring to FIGS. 10 and 11, top plan and front cross-sectional views of a two-layer interconnect structure 1000 are respectively shown, wherein a bottom conductive element (or layer) 1001 is electrically coupled to a top conductive element (or layer) 1002 by a vertical connection such as a via 1003. In this example, meshing may be performed starting with either the top or bottom layer. The via 1003 in this case is treated as a "point" so that it is effectively ignored for meshing purposes.

Figure 12:
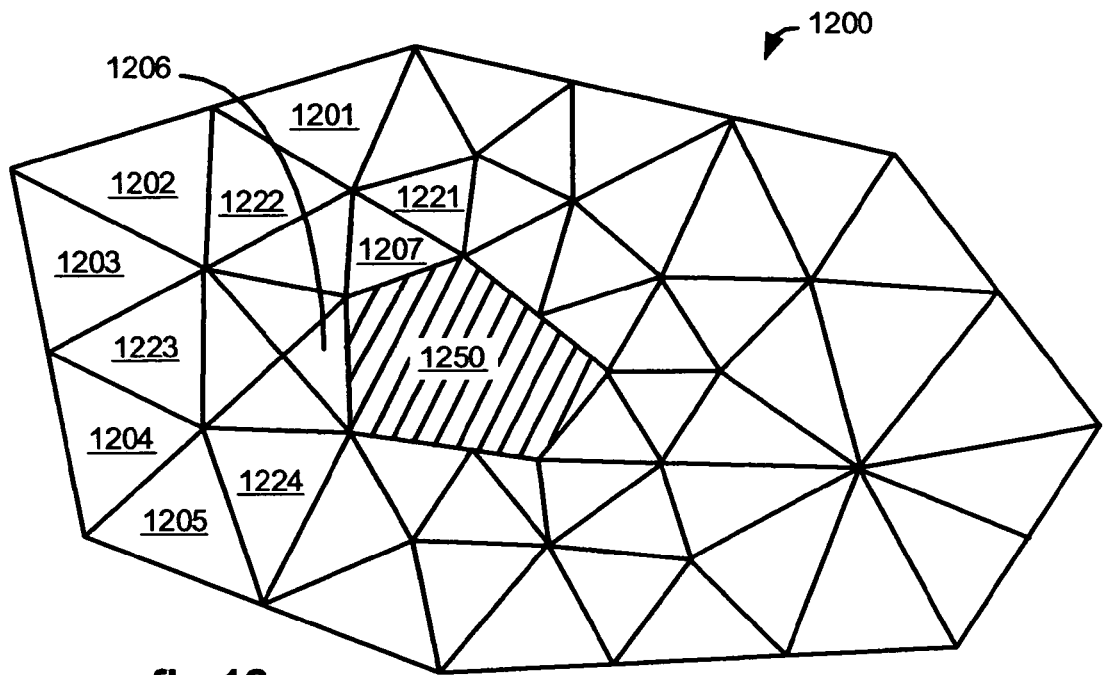
FIG. 12 illustrates a top plan view of a layer of an interconnect structure with representative meshes depicted thereon.

Although meshing may be used on a simple interconnect structure such as the two-layer interconnect structure 1000 in FIGS. 10 and 11, it is particularly useful when irregularly shaped interconnect structures are to be processed. For example, FIG. 12 illustrates a top plan view of an irregularly shaped layer 1200 of an interconnect structure that includes a hole 1250 which is commonly used, for example in printed circuit board and packaging designs, for passing connections between layers above and below the current layer without connecting to the current layer. As shown in the figure, the surface of the irregularly shaped layer 1200 is meshed with a plurality of meshes so as to completely cover its surface. Among the meshes are a number of edge meshes that have at least one outer edge that does not abut an edge of another mesh in the layer (such as edge meshes 1201~1207), and a number of interior meshes having all of their edges abutting an edge of another mesh (such as interior meshes 1221~1224).

After meshing each layer of the interconnect structure, in 204, area RLGC coefficients are generated for all meshes defined on the interconnect structure, while fringe RLGC coefficients are generated for only the edge meshes of the interconnect structure. Generation of the fringe RLGC coefficients is preferably performed using an RLGC library. Additional details on the generation of and information included in the RLGC library are described below in reference to FIG. 3, and additional details on the generation of the area and fringe RLGC coefficients are further described below in reference to FIGS. 8 and 9.

In 205, a T or Π or transmission line RLGC circuit model is then defined for each of the meshes using its respective area and fringe RLGC coefficients. The T or Π or transmission line RLGC circuit models for all of the meshes defined for an interconnect structure are then coupled together. One example of such coupling together of T or Π RLGC circuit models is described in Joong-Ho Kim and Madhavan Swaminathan, "Modeling of Irregular Shaped Power Distribution Planes Using Transmission Matrix Method," *IEEE Transactions on Advanced Packaging*, Vol. 24, No. 3, August 2001, pp. 334-346; and an example of such coupling together of transmission line RLGC circuit models is described in Henry Hungjen Wu, Jeffrey W. Meyer, Keunmyung Lee, and Alan Barber, "Accurate Power Supply and Ground Plane Pair Models," *IEEE Transactions on Advanced Packaging*, Vol. 22, No. 3, August 1999, pp. 259-266.

In 206, vertical connections (such as vias, bondwires, solder balls, or solder bumps) in the selected interconnects are identified, and corresponding equivalent RLGC circuits are associated with the vertical connections. The equivalent RLGC circuits in this case may have been predetermined through empirical testing of previously fabricated vertical connections or they may be calculated using the 2-D field solver.

In 207, an equivalent RLGC network is formed for each interconnect structure by coupling the vertical connection RLGC circuits generated in 206 to RLGC circuits generated in 205 that correspond to meshes that abut or include the vertical connections.

In 208, the equivalent RLGC networks for the selected interconnect structures are then solved or simulated using SPICE or a circuit solver for their output voltages, currents and/or S-parameters.

Figure 3:
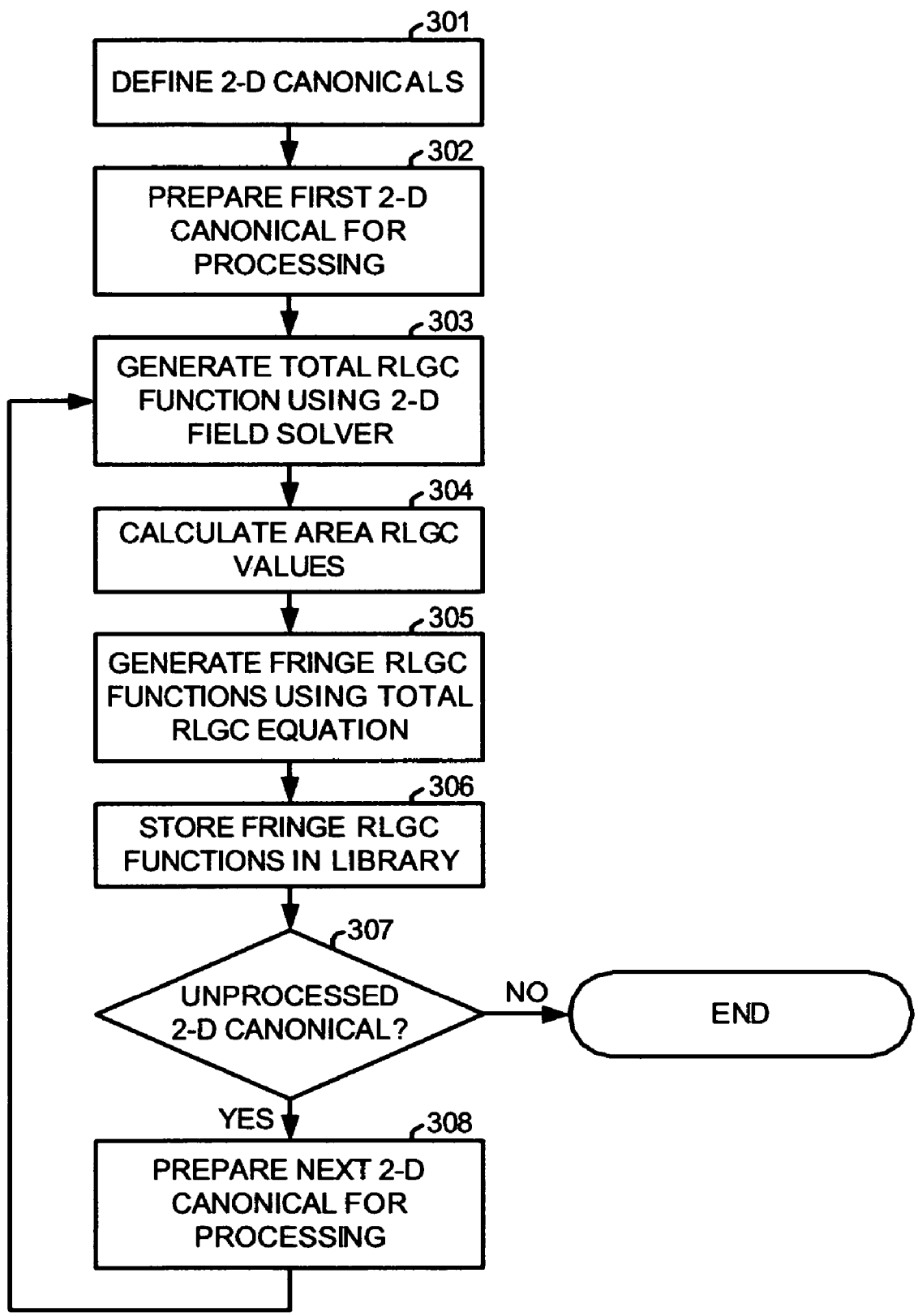
FIG. 3 illustrates a flow diagram of a method for building an RLGC library, utilizing aspects of the present invention.

FIG. 3 illustrates, as an example, a flow diagram of a method for building an RLGC library such as the one used in the method described in reference to FIG. 2.

In 301, a set of 2-D canonical interconnect structures are conventionally defined so as to be representative of 2-D cross-sectionals generated for design interconnects. The set of 2-D canonical interconnect structures in this case is basically the same as provided in conventional libraries of this sort. The key difference between those libraries and the RLGC library of the present invention is not their 2-D canonical structures, but the additional fringe RLGC functions provided therein.

Figure 4:
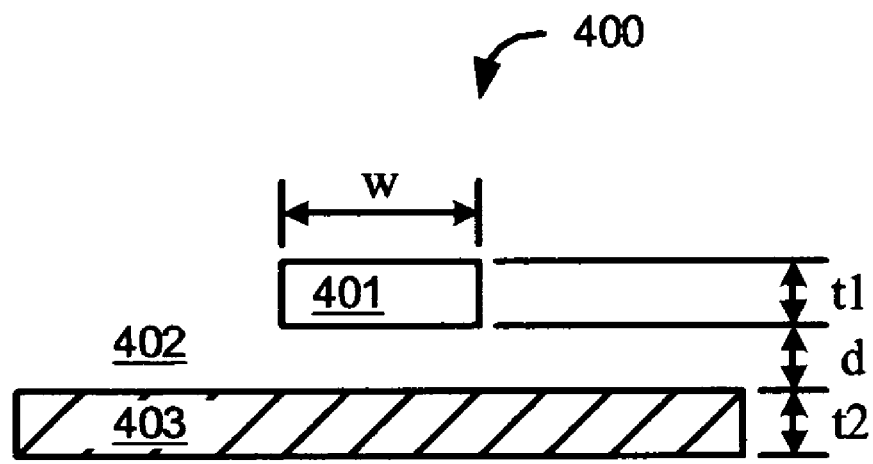
FIG. 4 illustrates a cross-sectional view of a first 2-D canonical interconnect structure including a homogeneous dielectric layer separating conductive and power/ground elements.
Figure 5:
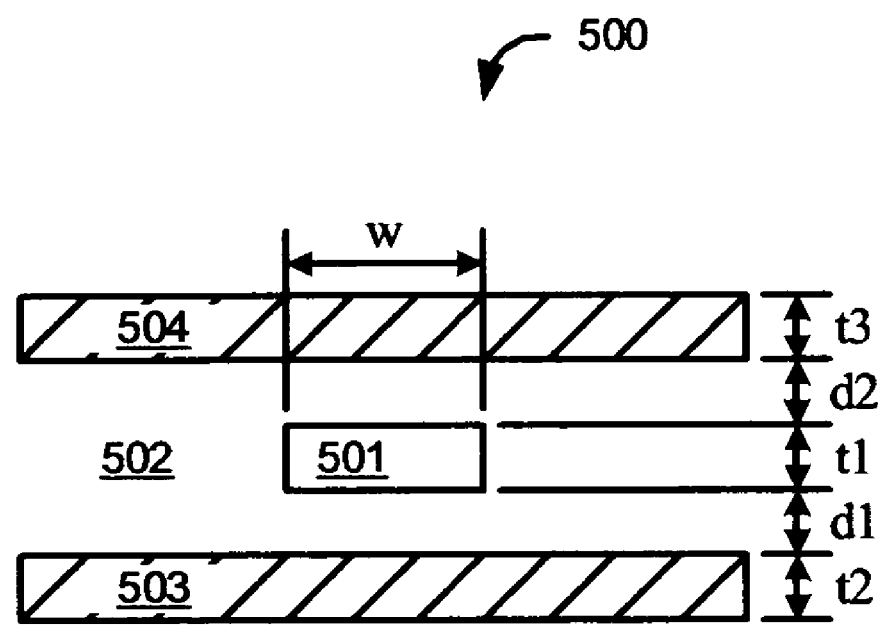
FIG. 5 illustrates a cross-sectional view of a second 2-D canonical interconnect structure including a homogeneous dielectric layer separating a conductive element from power/ground elements respectively disposed above and below the conductive element.
Figure 6:
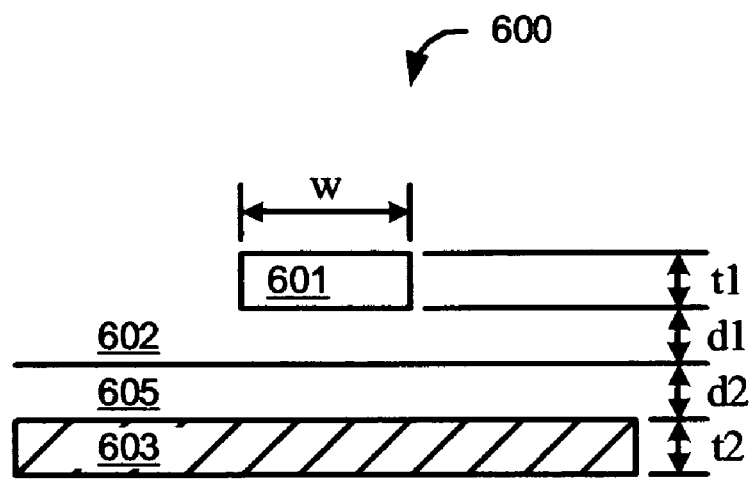
FIG. 6 illustrates a cross-sectional view of a third 2-D canonical interconnect structure including inhomogeneous dielectric layer(s) separating conductive and power/ground elements.
Figure 7:
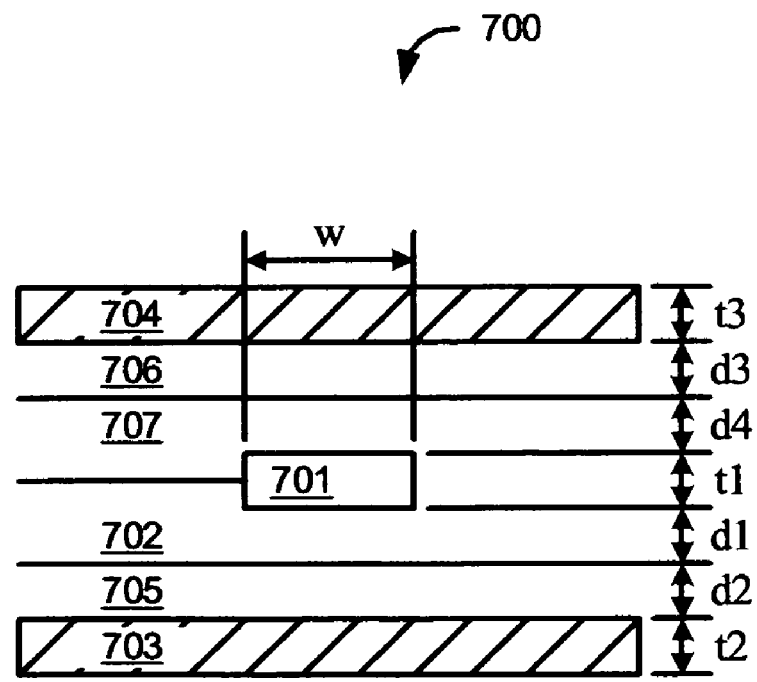
FIG. 7 illustrates a cross-sectional view of a fourth 2-D canonical interconnect structure including inhomogeneous dielectric layer(s) separating a conductive element from power/ground elements respectively disposed above and below the conductive element.

For illustrative purposes in this example, the RLGC library includes fringe RLGC functions for the 2-D canonical interconnect structures illustrated in FIGS. 4~7, wherein FIG. 4 illustrates a cross-sectional view of a first 2-D canonical interconnect structure 400 including a homogeneous dielectric layer 402 separating conductive element 401 and power/ground element 403; FIG. 5 illustrates a cross-sectional view of a second 2-D canonical interconnect structure 500 including a homogeneous dielectric layer 502 separating a conductive element 501 from power/ground elements 504 and 503 respectively disposed above and below the conductive element 501; FIG. 6 illustrates a cross-sectional view of a third 2-D canonical interconnect structure 600 including inhomogeneous dielectric layer 602, 605 separating conductive element 601 and power/ground element 603; and FIG. 7 illustrates a cross-sectional view of a fourth 2-D canonical interconnect structure 700 including inhomogeneous dielectric layer 706, 707 separating a conductive element 701 from a power/ground element 704 disposed above the conductive element 701, and inhomogeneous dielectric layer 702, 705 separating the conductive element 701 from a power/ground element 703 disposed below the conductive element 701.

Each of the conductive elements 401, 501, 601, and 701 in FIGS. 4~7 is representative of an interconnect or net in an integrated circuit, or a signal trace in a printed circuit board or an integrated circuit package (all of which are understood to be included in the term "interconnect" as used herein). Each conductive element serves as a primary path for transmitting an electrical signal having a frequency "f" in Hertz (or its equivalent "ω" in radians/second), and is conventionally characterized by a width "w", thickness "t" and conductivity "σ".

Each of the power/ground elements in FIGS. 4~7, on the other hand, is representative of a power bus, ground plane, or substrate in an integrated circuit, or a power or ground plane in a printed circuit board or an integrated circuit device package. Each of the power/ground elements is conventionally characterized by a thickness "t" and conductivity "σ".

The dielectric layers in FIGS. 4~7 separate their respective conductive elements from corresponding power/ground elements. They may be formed of $SiO_2$, for example, in an integrated circuit, or other dielectric material conventionally used in integrated circuit, printed circuit board, or integrated circuit packages. Each dielectric layer is characterized by a dielectric constant "ϵ", permeability "μ", and loss tangent "tan δ".

A homogeneous dielectric layer such as 402 in FIG. 4 and 502 in FIG. 5 has the same dielectric constant, permeability, and loss tangent throughout the layer. An inhomogeneous dielectric layer, on the other hand, includes two or more regions such as regions 602 and 605 in FIG. 6, regions 702 and 705 in FIG. 7, and regions 706 and 707 in FIG. 7, that have different dielectric constants and loss tangents.

After defining the 2-D canonical interconnect structures to be included in the RLGC library, in 302, a first one of the 2-D canonical interconnect structures is prepared for processing by retrieving its process dependent material values (e.g., dielectric constants, permeability values, loss tangents, and conductivities) and structural values (e.g., conductive element to power/ground element distances, dielectric region thicknesses, conductive element widths and thicknesses, and power/ground element thicknesses) from a technology file.

In 303, the 2-D field solver is invoked to calculate a total capacitance function ($C_t/l$) normalized to a per-unit-length basis, a total inductance function ($L_t/l$) normalized to a per-unit-length basis, a total resistance function ($R_t/l$) normalized to a per-unit-length basis, and a total conductance function ($G_t/l$) normalized to a per-unit-length basis for the 2-D canonical interconnect structure over a range of selected width ("w") values for its conductive element.

In 304, area RLGC coefficients are computed for the 2-D canonical interconnect structure. For example, the area capacitance ("Ca"), area conductance ("Ga"), and area inductance ("La") coefficients may respectively be calculated from the following equations:

$$C_a - j \times \frac{G_a}{\omega} = \frac{\varepsilon^*_{\mathit{eff}}}{d_{\mathit{eff}}} \quad (1)$$

$$L_a = \frac{\mu \times d_{\mathit{eff}}}{w^2} \quad (2)$$

where, $$\varepsilon^*_{\mathit{eff}} = \varepsilon_{\mathit{eff}} \times (1 - j \times \tan\delta_{\mathit{eff}}) \quad (3)$$

and determination of the effective dielectric constant ("$\varepsilon_{\mathit{eff}}$"), the effective loss tangent ("$\tan \delta_{\mathit{eff}}$"), and the effective conductive element to power/ground element distance ("$d_{\mathit{eff}}$") depend on the 2-D canonical interconnect structure and its associated process parameters.

For example, for the 2-D canonical interconnect structure 400 of FIG. 4, the effective dielectric constant, effective loss tangent, and effective conductive element to power/ground element distance are simply the values provided for those parameters in the technology file.

For the 2-D canonical interconnect structure 500 of FIG. 5, the effective conductive element to power/ground element distance is slightly more complicated, and may be computed from the following equation:

$$d_{\mathit{eff}} = d1 \mathbin{/\mkern-5mu/} d2 = \frac{d1 \times d2}{d1 + d2} \quad (3)$$

The effective dielectric constant and loss tangent for this structure are also simply the values provided for these parameters in the technology file, since the dielectric layer 502 is homogeneous.

For the 2-D canonical interconnect structure 600 of FIG. 6, the effective conductive element to power/ground element distance is simply the sum of the distances d1 and d2. The area capacitance calculation, however, is slightly more complicated, and may be calculated using the following equation:

$$\frac{\varepsilon^*_{\mathit{eff}}}{d_{\mathit{eff}}} = \frac{\varepsilon^*_1}{d1} \mathbin{/\mkern-5mu/} \frac{\varepsilon^*_2}{d2} = \frac{\frac{\varepsilon^*_1}{d1} \times \frac{\varepsilon^*_2}{d2}}{\frac{\varepsilon^*_1}{d1} + \frac{\varepsilon^*_2}{d2}} \quad (4)$$

where "$\varepsilon_1^*$" and "$\varepsilon_2^*$" are respectively the complex dielectric constants for the dielectric regions 602 and 605, and are similar in form to equation (3). Parameter values for calculating each of these complex dielectric constants can be retrieved from the technology file in the same manner as those for the complex dielectric constant of equation (3).

For the 2-D canonical interconnect structure 700 of FIG. 7, both the effective conductive element to power/ground element distance and the area capacitance calculation are even more complicated, and may be calculated using the following equations:

$$d_{\mathit{eff}} = (d1 + d2) \mathbin{/\mkern-5mu/} (d3 + d4) \quad (5)$$

$$\frac{\varepsilon^*_{\mathit{eff}}}{d_{\mathit{eff}}} = \left(\frac{\varepsilon^*_1}{d1} \mathbin{/\mkern-5mu/} \frac{\varepsilon^*_2}{d2}\right) + \left(\frac{\varepsilon^*_3}{d3} \mathbin{/\mkern-5mu/} \frac{\varepsilon^*_4}{d4}\right) \quad (6)$$

where the symbol "$/\!/$" indicates the following operation be performed on variables "a" and "b":

$$a \mathbin{/\mkern-5mu/} b = \frac{a \times b}{a + b} \quad (7)$$

Determination of the area resistance ("Ra") coefficient generally also depends on the 2-D canonical interconnect structure and its associated process parameters.

For example, for the 2-D canonical interconnect structure 400 of FIG. 4, the area resistance ("Ra") coefficient may be calculated using the following equations:

$$R_a = \frac{1}{w^2}\sqrt{\frac{\omega \times \mu}{2 \times \sigma_1}} + \frac{1}{w^2}\sqrt{\frac{\omega \times \mu}{2 \times \sigma_2}} + R_{dc} \quad (8)$$

$$R_{dc} = \frac{1}{\sigma_1 \times w^2 \times t_1} + \frac{1}{\sigma_2 \times w^2 \times t_2} \quad (9)$$

Since the area resistance ("Ra") coefficient is the same for both homogeneous and inhomogeneous dielectric layer structures, equations (8) and (9) are also applicable to the 2-D canonical interconnect structure 600 of FIG. 6 as well as the structure 400 of FIG. 4. For the 2-D canonical interconnect structures 500 of FIG. 5 and 700 of FIG. 7, however, the area resistance ("Ra") coefficient equation may be approximated as follows:

$$Ra = \left(\frac{1}{\sigma_1 \times t_1 \times w^2} + \frac{1}{2 \times w^2} \times \sqrt{\frac{\omega \times \mu}{2 \times \sigma_1}}\right) + \quad (10)$$

$$\left\{\left(\frac{1}{\sigma_2 \times t_2 \times w^2} + \frac{1}{2 \times w^2} \times \sqrt{\frac{\omega \times \mu}{2 \times \sigma_2}}\right) / /\right.$$

$$\left.\left(\frac{1}{\sigma_3 \times t_3 \times w^2} + \frac{1}{2 \times w^2} \times \sqrt{\frac{\omega \times \mu}{2 \times \sigma_3}}\right)\right\}$$

where $\sigma_1$ and t1 are respectively the conductivity and thickness of the conductive element 501 of FIG. 5 and 701 of FIG. 7, $\sigma_2$ and t2 are respectively the conductivity and thickness of the lower power/ground element 503 of FIG. 5 and 703 of FIG. 7, and $\sigma_3$ and t3 are respectively the conductivity and thickness of the upper power/ground element 504 of FIG. 5 and 704 of FIG. 7.

The area conductance ("Ga") coefficient, on the other hand, is a function of the area capacitance ("Ca") and consequently, can be determined for each of the 2-D canonical interconnect structures using the above described calculations for the area capacitance ("Ca") coefficients.

In 305, the fringe RLGC functions are then determined for the 2-D canonical interconnect structure using the following equations along with the per-unit-length total capacitance ($C_t/l$), per-unit-length total inductance ($L_t/l$), per-unit-length total resistance ($R_t/l$), and per-unit-length total conductance ($G_t/l$) functions generated in 302 and the area RLGC coefficient values calculated in 303 over the same range of selected width ("w") values for its conductive element used in 302.

$$\frac{C_t}{l} = C_a \times w + 2 \times C_f \quad (11)$$

$$\frac{L_t}{l} = \frac{L_a \times w \times \frac{L_f}{2}}{L_a \times w + \frac{L_f}{2}} \quad (12)$$

$$\frac{R_t}{l} = \frac{R_a \times w \times \frac{R_f}{2}}{R_a \times w \times \frac{R_f}{2}} \quad (13)$$

$$\frac{G_t}{l} = G_a \times w + 2 \times G_f \quad (14)$$

In 306, the fringe RLGC functions are then stored in the RLGC library so as to be associated with the 2-D canonical interconnect structure. Consequently, when a cross-section of a design interconnect structure matches the 2-D canonical interconnect structure, its associated fringe RLGC functions can be retrieved from the RLGC library and fringe RLGC coefficients for the design interconnect structure can be readily calculated through interpolation of the retrieved fringe RLGC functions by the width (and spacing if appropriate) of a conductive element in the design interconnect structure.

In 307, a determination is then made whether there is another 2-D canonical interconnect structure to be processed for the RLGC library. If the determination in 307 is NO, then the method ends until additional 2-D canonical interconnect structures are defined by going back to 301. On the other hand, if the determination in 307 is YES, then the next one of the 2-D canonical interconnect structures is prepared for processing by retrieving its process dependent material values and structural values from the technology file, and the method jumps back to 303 to process that 2-D canonical interconnect structure.

In the above example, the 2-D canonical interconnect structures illustrated in FIGS. 4~7 are each only single conductive element structures. If additional 2-D canonical interconnect structures are defined in 301 having multiple conductive elements on a same metal layer (i.e., disposed horizontally with respect to each other), then the above method to generate an RLGC library as described in reference to FIG. 3 would be modified in the following ways. First, the generation of the total RLGC functions in 303 would be performed by invoking the 2-D field solver to solve the multiple conductive element structures for selected spacings ("s") or distances between adjacent conductive elements in the same metal layer and for selected widths ("w") of the conductive elements. Secondly, in addition to calculating a contribution to the total RLGC functions by area parasitics, lateral parasitics should also be taken into account when generating the fringe RLGC functions for those multiple conductive element 2-D canonical interconnect structures in 305.

Figure 8:
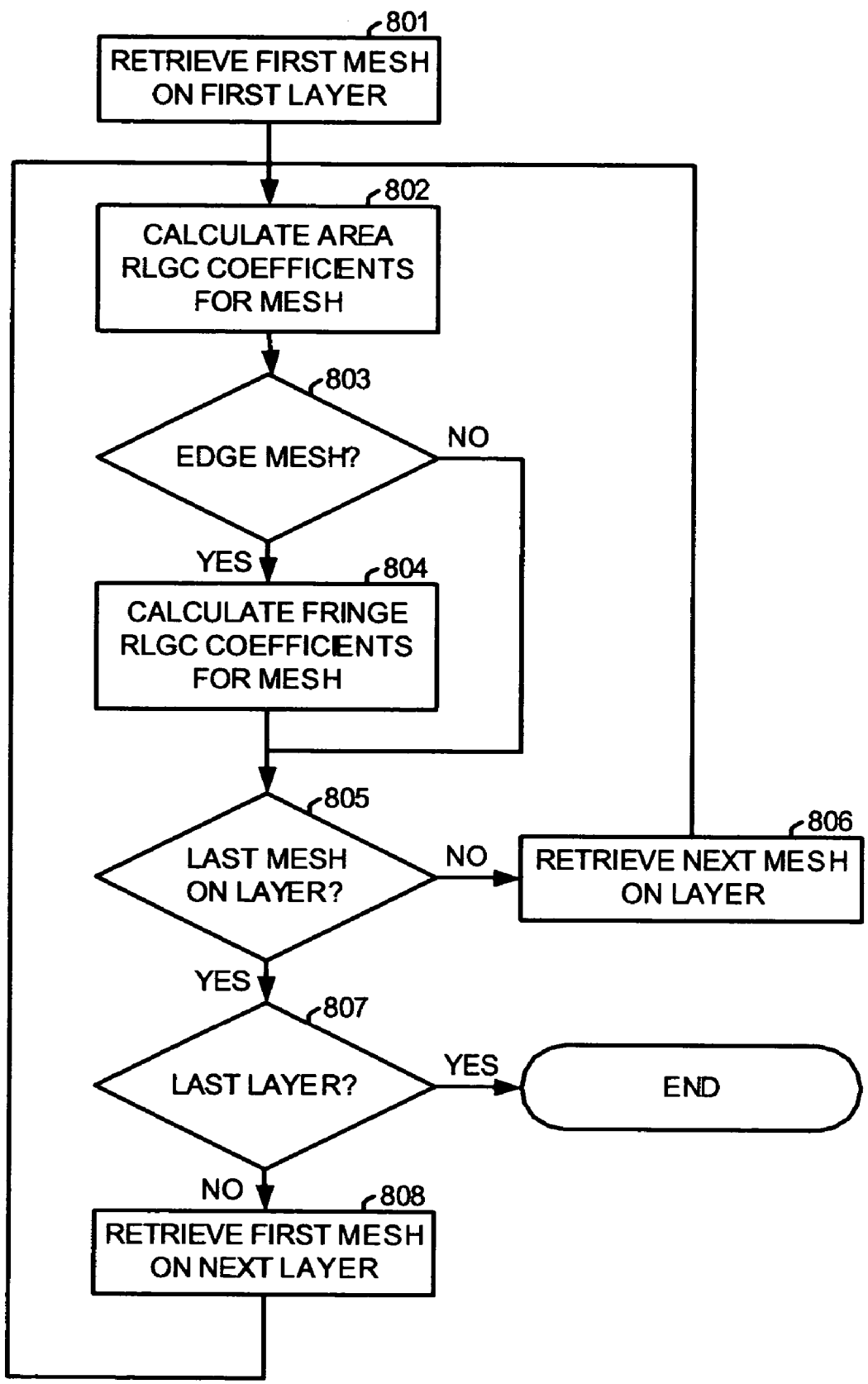
FIG. 8 illustrates a method for generating area and fringe RLGC coefficients for an interconnect structure, utilizing aspects of the present invention.

FIG. 8 illustrates a method for generating RLGC coefficients for an interconnect structure, such as performed in 204 of FIG. 2. To begin the method, in 801, information of a first mesh on a first layer of the interconnect structure is retrieved.

In 802, area RLGC coefficients for the mesh are calculated "on-the-fly" using area RLGC equations as described in reference to 304 of FIG. 3. To determine the appropriate set of area RLGC equations to use, a 2-D cross-sectional of an interconnect structure is first defined by a plane extending orthogonally through the mesh. Area RLGC equations corresponding to the thus defined interconnect structure are then used in the area RLGC calculations with process parameters related to the fabrication of the interconnect structure retrieved from a technology file.

In 803, a determination is made whether the current mesh is an edge mesh. An edge mesh in this case is defined as a mesh having at least one edge that does not abut an edge of another mesh on the same layer. If the determination in 803 is NO (i.e., the current mesh is not an edge mesh), then the method proceeds directly to 805. On the other hand, if the determination in 803 is YES (i.e., the current mesh is an edge mesh), then the method first performs 804 before proceeding to 805.

In 804, since the current mesh has been determined to be an edge mesh for the design interconnect structure, fringe RLGC coefficients are calculated for the mesh using an associated width value and fringe RLGC functions retrieved from the RLGC library. Additional details on determining the associated width value and appropriate fringe RLGC functions to be retrieved from the RLGC library are described in reference to FIG. 9 below. The width of the conductive element for the design interconnect structure is then used to interpolate the fringe RLGC coefficients from the fringe RLGC functions retrieved from the RLGC library.

In 805, a determination is then made whether the current mesh is a last mesh to be processed on the current layer of the design interconnect structure. If the determination in 805 results in a NO (i.e., there is another mesh to be processed on the current layer), then in 806, the method retrieves information of the next mesh to be processed, and jumps back to 802 to process that mesh. On the other hand, if the determination in 805 results in a YES (i.e., there are no more meshes to be processed in the current layer), then in 807, a determination is made whether the current layer is the last layer of the interconnect structure to be processed. If the determination in 807 is a YES (i.e., there are no more layers of the interconnect structure to be processed), then the method ends. On the other hand, if the determination in 807 is NO (i.e., there is another layer of the interconnect structure to be processed), then in 808, the method retrieves information for a first mesh of the next layer to be processed and jumps back to 802 to process that mesh.

Figure 9:
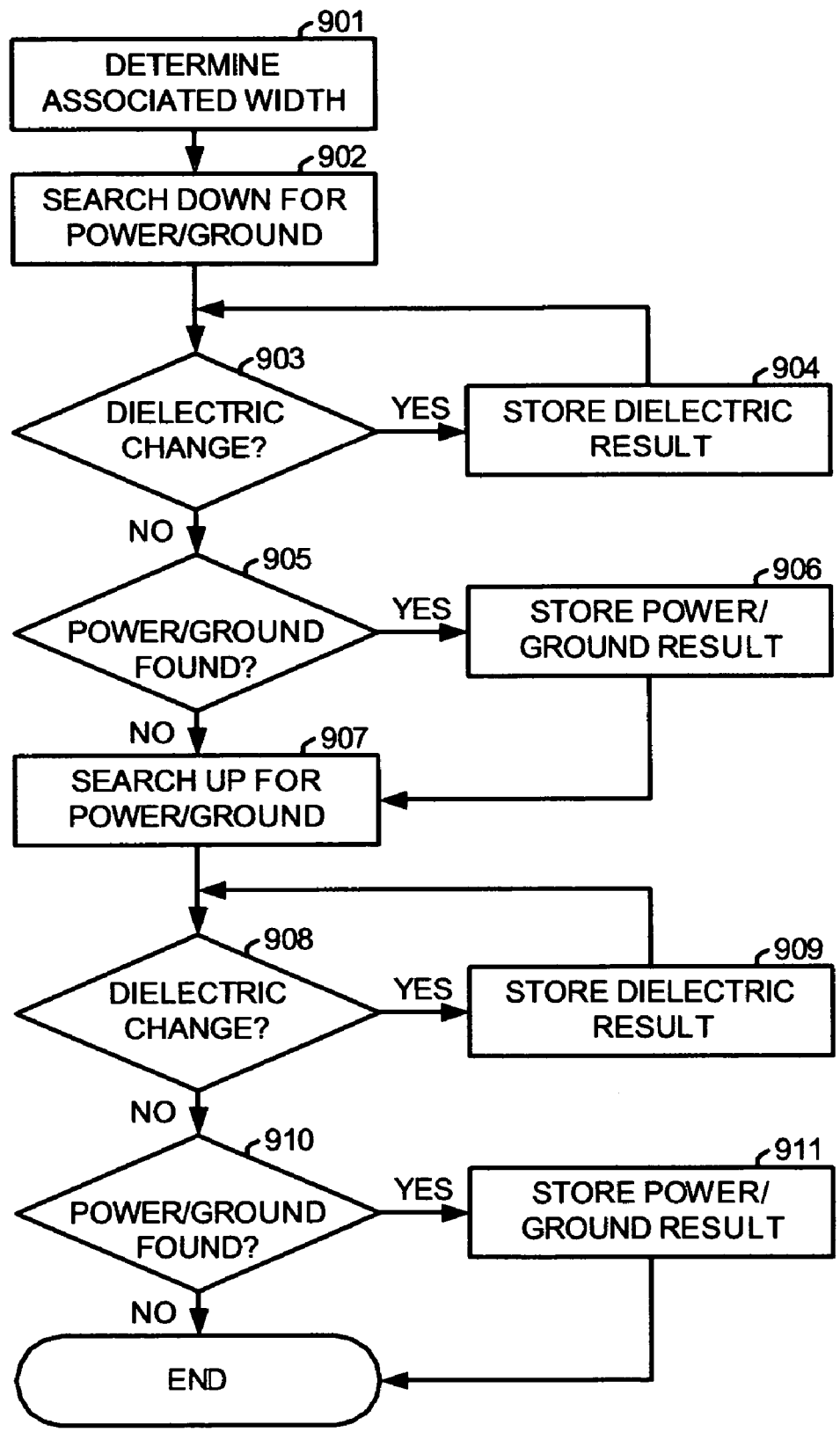
FIG. 9 illustrates a method for determining an effective interconnect structure for calculating fringe RLGC coefficients of an edge mesh, utilizing aspects of the present invention.

FIG. 9 illustrates a method for determining an effective interconnect structure for calculating fringe RLGC coefficients of an edge mesh. In 901, an associated width for the edge mesh is first determined. In one method for determining the associated width value for an edge mesh, a line is first defined such that it is perpendicular to and bisects an outer edge of the edge mesh. As previously described, an "outer edge" is an edge of the edge mesh that does not abut another mesh on the current layer being processed.

Figure 13:
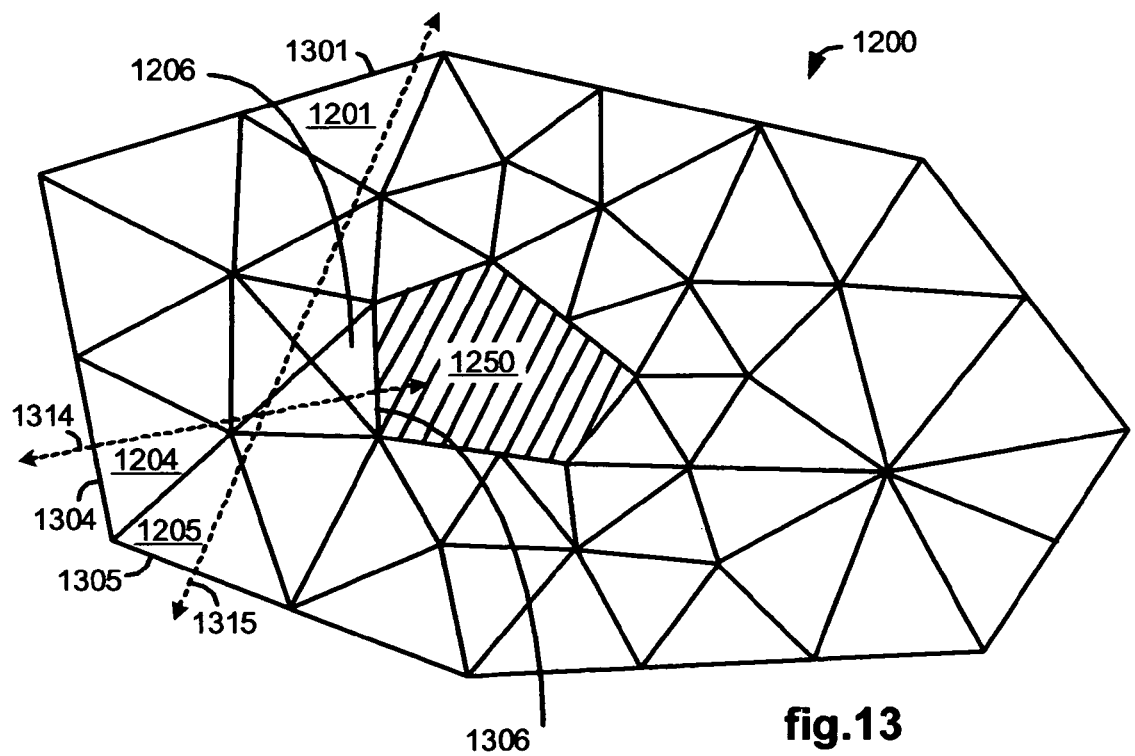
FIG. 13 illustrates a top plan view of the layer of the interconnect structure depicted in FIG. 12 with a couple of representative edge meshes and their associated widths depicted thereon.

The associated width value is then determined as the distance along the defined line from its intersection point with the outer edge to another outer edge of another edge mesh. For example, in FIG. 13, an associated width may be determined for an edge mesh 1205 that extends along its associated perpendicular line 1315 from a mid-point of an outer edge 1305 of the edge mesh 1205 to an outer edge 1301 of another edge mesh 1201, and another associated width may be determined for an edge mesh 1204 that extends along its associated perpendicular line 1314 from a mid-point of an outer edge 1304 of the edge mesh 1204 to an outer edge 1306 of another edge mesh 1206 that abuts the hole 1250.

After determining the associated width for the edge mesh, in 902, the method starts to search in a downward direction from the line used in defining the associated width for a power/ground element. For the 2-D canonical interconnect structures 400, 500, 600 and 700 respectively of FIGS. 4~7, it is assumed that such a power/ground element will be found before encountering another conductive element. This assumption is generally valid in the case of printed circuit board and integrated circuit design packages, since signal traces in those designs are commonly sandwiched between power and ground planes to minimize cross-talk between the signal layers. The assumption, however, is not generally valid in integrated circuit designs. Therefore, for integrated circuit designs, either the RLGC library is expanded to include 2-D canonical interconnect structures for multiple conductive elements in the vertical direction, or conductive elements encountered while performing 902 (and 907) are ignored. In practice, this second approach has been used with acceptable results, since the interactions between the conductive elements in this case have been found to be significantly less than those between a conductive element and a power/ground element with respect to fringe RLGC parasistics associated with the conductive element.

While performing 902, the method also looks for dielectric region changes (i.e., whether the dielectric layer beneath the conductive element upon whose surface the edge mesh has been defined is homogeneous or inhomogeneous). Accordingly, a determination of whether it has found such a change is continually performed in 903. If the determination in 903 results in a YES (meaning that a dielectric change has been found), then in 904, the method stores the dielectric results (e.g., distance traversed in the dielectric layer until the dielectric change is detected, and the dielectric constants for the dielectric regions), and continues to search for another dielectric constant change in 903.

Meanwhile, the method continues to search for a power/ground element so that in 905, a determination is made whether a power/ground element has been found before hitting absolute bottom of the design interconnect structure. If such a power/ground element is found, then in 906, the method stores the power/ground results (e.g., distance traversed in the dielectric layer until the power/ground element is detected, and any process parameters read out of the technology file for the power/ground element), and then proceeds to 907 to perform a similar search in the upward direction. If no power/ground element is found in the 905 determination before the search hits absolute bottom of the design interconnect structure, then the method simply proceeds to 907 to perform the similar search in the upward direction.

In 907~911, the same procedure as described in reference to 902~906 is generally performed in the upward direction. In particular, if a power/ground element is found while performing 907 in the upward direction, then in 911, the method stores the power/ground results, and then ends. On the other hand, if a power/ground element is not found while performing 907 in the upward direction before the search hits the top of the design interconnect structure, then the method also ends with an indication of such failure being provided so that the cross-sectional of the design interconnect structure can be determined.

Figure 14:
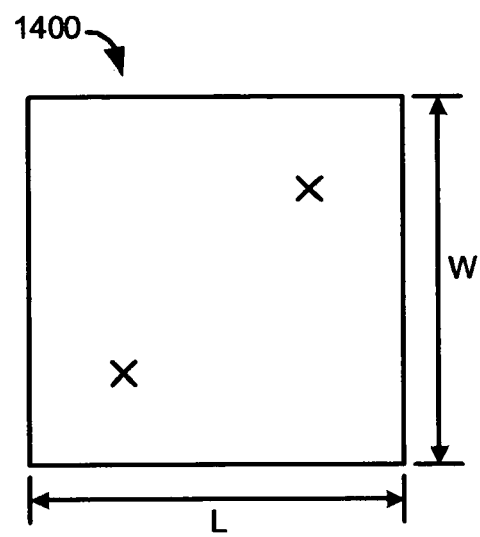
FIG. 14 illustrates a top plan view of a square plate interconnect structure.

FIG. 14 illustrates a top plan view of a square plate interconnect structure 1400. The square plate in this case is a conductive element having a width "W" of 200 mils, a length "L" of 200 mils, and a thickness "t1" of 1 mil. It resides on a substrate having a height of 4 mils and a dielectric constant "$\epsilon$" of 4.4, and in a dielectric layer also having a dielectric constant of "$\epsilon$" of 4.4. Port locations are in the centers of a top right quadrant and a bottom left quadrant of the square plate, and are shown as X's.

Figure 15:
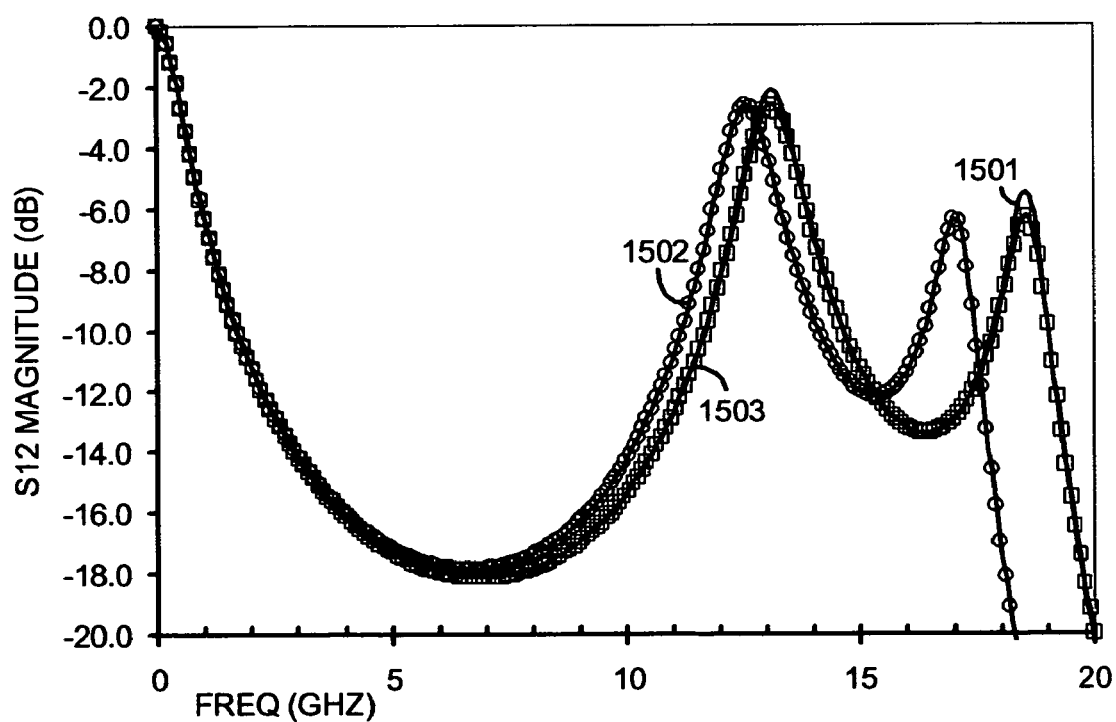
FIG. 15 illustrates comparative frequency responses of a 3-D full-wave extraction model, area RLGC with fringe capacitance model, and area RLGC with fringe RLGC model for the square plate interconnect structure of FIG. 14.

FIG. 15 illustrates comparative comparative frequency responses of a 3-D full-wave extraction model 1401, a conventional area RLGC with fringe capacitance model 1402, and an area RLGC with fringe RLGC model 1403 of the present invention (also referred to herein simply as the "fringe RLGC model") for the square plate interconnect structure 1400 of FIG. 14.

By inspecting the frequency responses, the interconnect frequency response resulting from the fringe RLGC model 1403 (solid line with superimposed squares) is almost identical to that of the 3-D full-wave extraction model 1401 (solid line only). The interconnect frequency response resulting from the area RLGC with fringe capacitance model 1402 (solid line with superimposed circles) clearly provides a less accurate result than that of the fringe RLGC model 1403, especially at high frequencies. The processor and memory requirements for the fringe RLGC model, however, are very close to those of the area RLGC with fringe capacitance, and much less than those of the 3-D full-wave extraction model, while computation of the fringe RLGC model is performed 100's of times faster than the 3-D full-wave extraction model.

Figure 16:
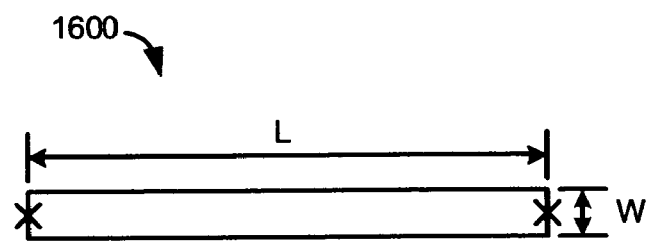
FIG. 16 illustrates a top plan view of a thin micro-strip interconnect structure.

FIG. 16 illustrates a top plan view of a thin trace interconnect structure 1600. The thin trace in this case is a conductive element having a width "W" of 5 mils, a length "L" of 132 mils, and a thickness "t1" of 1 mil. It resides on a substrate having a thickness of 5 mils and a dielectric constant "$\epsilon$" of 4.4. Above the thin trace is air having a dielectric constant of "$\epsilon$" of 1.0. Port locations are at opposite ends of the thin trace, and are shown as X's.

Figure 17:
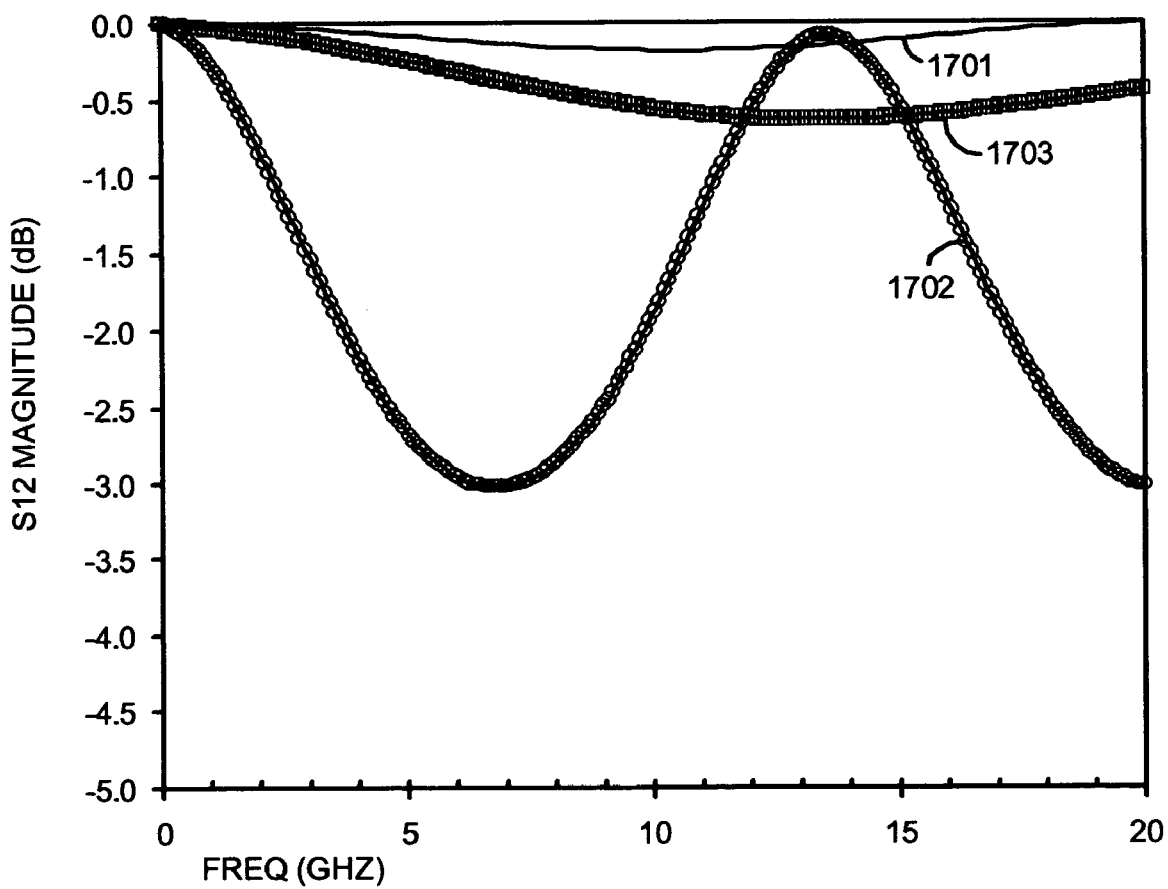
FIG. 17 illustrates comparative frequency responses of a 3-D full-wave extraction model, area RLGC with fringe capacitance model, and area RLGC with fringe RLGC model for the thin micro-strip interconnect structure of FIG. 16.

FIG. 17 illustrates comparative frequency responses of a 3-D full-wave extraction model 1701, a conventional area RLGC with fringe capacitance model 1702, and the fringe RLGC model 1703 of the present invention for the thin trace interconnect structure 1600. By inspecting the frequency responses, it is clear that the interconnect frequency response resulting from the fringe RLGC model 1703 (solid line with superimposed squares) is much closer to that of the 3-D full-wave extraction model 1701 (solid line only) than the interconnect frequency response resulting from the area RLGC with fringe capacitance model 1702 (solid line with superimposed circles). The processor and memory requirements for the fringe RLGC model, however, are very close to that of the area RLGC with fringe capacitance, and much less than that of the 3-D full-wave extraction model, while computation of the fringe RLGC model is performed 100's of times faster than the 3-D full-wave extraction model.

Figure 18:
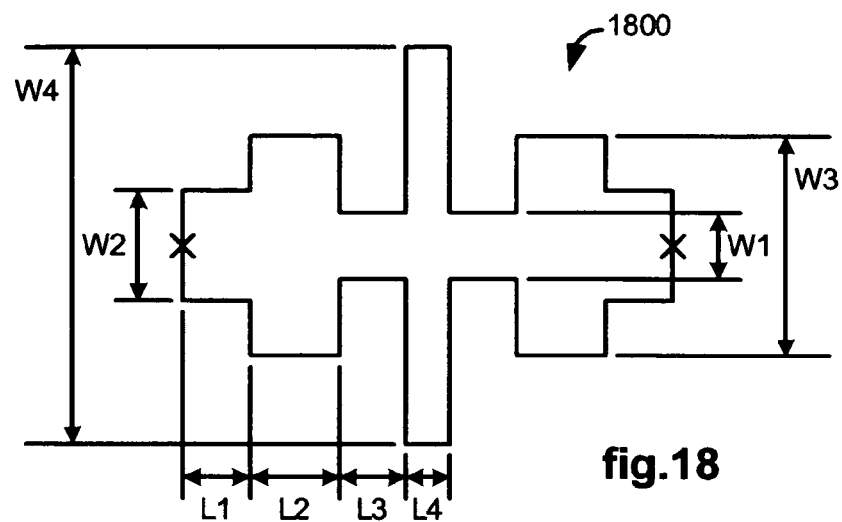
FIG. 18 illustrates a top plan view of a low-pass filter interconnect structure.

As another example, FIG. 18 illustrates a top plan view of a low-pass filter interconnect structure 1800. The low-pass filter in this case is a conductive element having a width "W1" of 0.33 mm, width "W2" of 0.63 mm, width "W3" of 3.42 mm, and width "W4" of 6.73 mm. Conductive element also has a length "L1" of 1.64 mm, length "L2" of 1.145 mm, length "L3" of 1.65 mm, and length "L4" of 0.635 mm. The conductive element is symmetrical around both vertical and horizontal axes. The conductive element also has a thickness "t1" of 0.06 mm. It resides on a substrate having a thickness of 0.635 mm and a dielectric constant "$\epsilon$" of 9.6. Above the low pass filter trace is air having a dielectric constant of "$\epsilon$" of 1.0. Port locations are at opposite ends of the low-pass filter trace, and are shown as X's.

A description of such a low-pass filter is described in J. Eric Bracken, Din-Kow Sun, and Zoltan J. Cendes, "S-Domain Methods for Simultaneous Time and Frequency Characterization of Electromagnetic Devices," *IEEE Transactions on Microwave Theory and Techniques*, Vol. 46, No. 9, September 1998, pp. 1277-1290.

Figure 19:
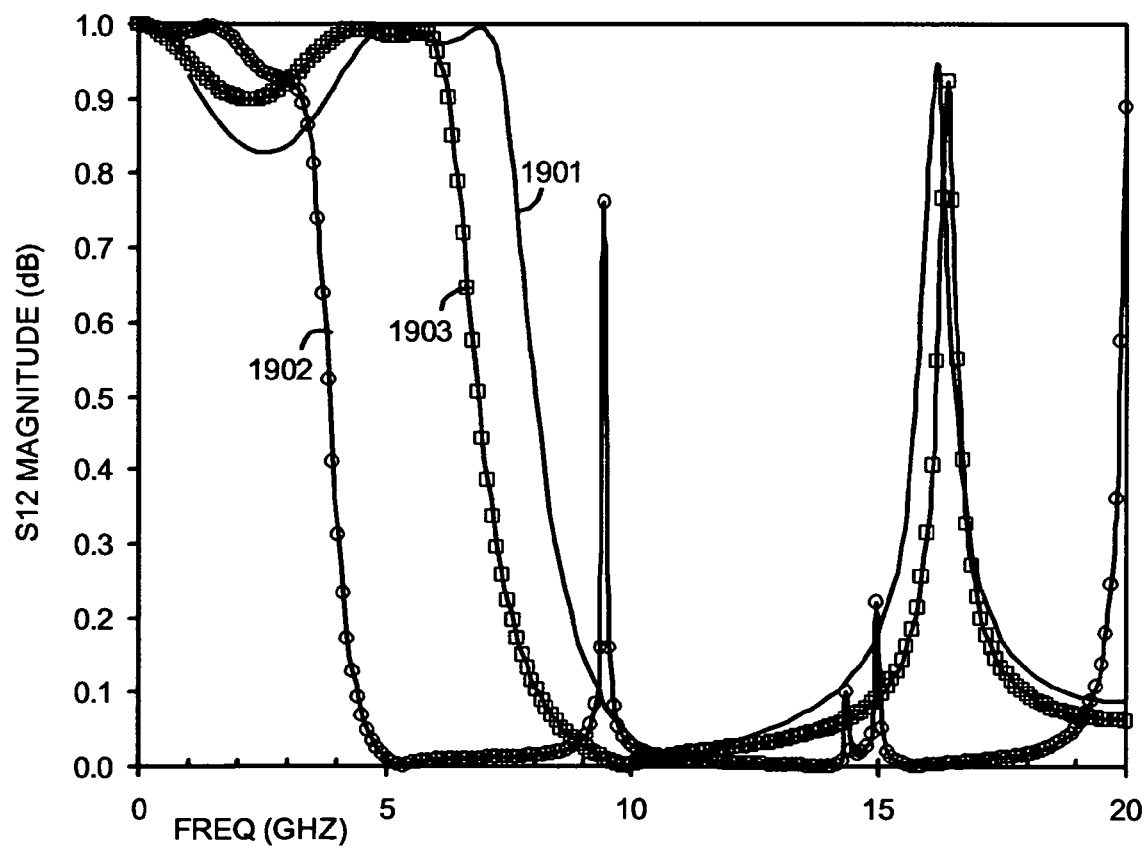
FIG. 19 illustrates comparative frequency responses of a 3-D full-wave extraction model, area RLGC with fringe capacitance model, and area RLGC with fringe RLGC model for the low-pass filter interconnect structure of FIG. 18.

FIG. 19 illustrates comparative frequency responses of a 3-D full-wave extraction model 1901, area RLGC with fringe capacitance model 1902, and area RLGC with fringe RLGC model 1903 (i.e., the fringe RLGC model) for the low-pass filter interconnect structure 1800. By inspecting the frequency responses, it is clear that the interconnect frequency response resulting from the fringe RLGC model 1903 (solid line with superimposed squares) is much closer to that of the 3-D full-wave extraction model 1901 (solid line only) than the interconnect frequency response resulting from the area RLGC with fringe capacitance model 1902 (solid line with superimposed circles). The processor and memory requirements for the fringe RLGC model, however, are again very close to that of the area RLGC with fringe capacitance model and much less than that of the 3-D full-wave extraction model, while computation of the fringe RLGC model is performed 100's of times faster than the 3-D full-wave extraction model.

In addition to the above frequency response comparisons, it is also noted that the fringe RLGC model provides valid results at DC and low frequencies where the 3-D full-wave extraction model breaks down.

Although the various aspects of the present invention have been described with respect to a preferred embodiment, it will be understood that the invention is entitled to full protection within the full scope of the appended claims.

We claim:

1. A method for designing an electronic device using one or more resistance, inductance, conductance, capacitance ("RLGC") coefficients, comprising:
   defining a plurality of meshes on a surface of an interconnect structure of the electronic device;
   calculating at least one area RLGC coefficient for each of the plurality of meshes;
   calculating at least one fringe RLGC coefficient for each mesh of the plurality of meshes that has an outer edge that does not abut an edge of another mesh of the plurality of meshes;
   simulating the electronic device using the calculated at least one area RLGC coefficient for each of the plurality of meshes and the calculated at least one fringe RLGC coefficient for each of the plurality of meshes that has an outer edge that does not abut an edge of another mesh of the plurality of meshes to generate a simulation result; and
   outputting the simulation result.

2. The method according to claim 1, wherein the calculation of the at least one area RLGC coefficient comprises: calculating a corresponding area resistance for each of the plurality of meshes.

3. The method according to claim 1, wherein the calculation of the at least one area RLGC coefficient corresponding to the interconnect structure comprises: calculating a corresponding area inductance for each of the plurality of meshes.

4. The method according to claim 1, wherein the calculation of the at least one area RLGC coefficient corresponding to the interconnect structure comprises: calculating a corresponding area conductance for each of the plurality of meshes.

5. The method according to claim 1, wherein the calculation of the at least one area RLGC coefficient corresponding to the interconnect structure comprises: calculating a corresponding area capacitance for each of the plurality of meshes.

6. The method according to claim 1, wherein each mesh that has an outer edge that does not abut an edge of another mesh of the plurality of meshes is referred to as an edge mesh, and the calculation of the at least one fringe RLGC coefficient for each edge mesh, comprises:
   defining a line that is perpendicular to the outer edge of the edge mesh, and bisects the outer edge at a bisection point;
   determining a width associated with the edge mesh as a distance extending along the defined line from the bisection point to an outer edge of another edge mesh; and
   calculating the at least one fringe RLGC coefficient using the determined associated width and information stored in an RLGC library for a 2-D canonical interconnect structure resembling a 2-D cross-sectional slice of the interconnect structure taken along the defined line.

7. The method according to claim 6, wherein the at least one fringe RLGC coefficient is a fringe inductance, and the information stored in the RLGC library is a fringe inductance function that is dependent on a width of the canonical interconnect structure.

8. The method according to claim 7, wherein the canonical interconnect structure comprises:
   a conductive element having a width "w" and providing a transmission path for an electrical signal;
   a power/ground element providing a return path for inductance generated by the electrical signal; and
   a dielectric layer having a permeability "$\mu$", and separating the conductive and the power/ground elements by a distance "d".

9. The method according to claim 8, wherein the fringe inductance function is determinable from the following total inductance equation:

$$Lt/l = [(La) \times (w) \times (Lf/2)]/[(La) \times (w) + (Lf/2)]$$

where Lt/l is the a total inductance function normalized to a per-unit-length basis, La is an area inductance, and Lf is the fringe inductance function for the canonical interconnect structure.

10. The method according to claim 9, wherein the area inductance "La" is calculated using the following equation:

$$La=(\mu \times d)/w^2.$$

11. The method according to claim 6, wherein the at least one fringe RLGC coefficient is a fringe resistance, and the information stored in the RLGC library is a fringe resistance function that is dependent on a width of the canonical interconnect structure.

12. The method according to claim 11, wherein the canonical interconnect structure comprises:
   a conductive element having a first width "w1", a first thickness "t1", and a first conductivity "σ1", and providing a transmission path for an electrical signal having a frequency "f";
   a power/ground element having a second width "w2", a second thickness "t2", and a second conductivity "σ2"; and
   a dielectric layer having a permeability "μ", and separating the conductive and the power/ground elements by a distance "d".

13. The method according to claim 12, wherein the fringe resistance function is determinable from the following total resistance equation:

$$Rt/l=[((Ra)\times(w))\times(Rf/2)]/[(Ra)\times(w))+(Rf/2)]$$

where Rt/l is a total resistance normalized to a per-unit-length basis, Ra is the area resistance, and Rf is the fringe resistance function for the canonical interconnect structure.

14. The method according to claim 13, wherein the area resistance is calculated using the following equation:

$$Ra=(1/w^2)\times(SQRT[(\omega\times\mu)/(2\times\sigma 1)])+(1/w^2)\times(SQRT[(\omega\times\mu)/(2\times\sigma 2)])+Rdc$$

where "ω"=2×Π×f in radians/second, and Rdc is a DC component of the area resistance.

15. The method according to claim 14, wherein the DC component of the area resistance is calculated using the following equation:

$$Rdc=[1/((\sigma 1)\times(w^2)\times(t1))]+[1/((\sigma 2)\times(w^2)\times(t2))].$$

16. The method according to claim 6, wherein the at least one fringe RLGC coefficient is a fringe conductance, and the information stored in the RLGC library is a fringe conductance function that is dependent on a width of the canonical interconnect structure.

17. The method according to claim 6, wherein the canonical interconnect structure comprises:
   a conductive element having a width "w" and providing a transmission path for an electrical signal having a frequency "f";
   a power/ground element; and
   a dielectric layer separating the conductive and the power/ground elements by a distance "d".

18. The method according to claim 17, wherein the fringe conductance function is determinable from the following total conductance equation:

$$Gt/l=[(Ga)\times(w)]+(2)\times(Gf)$$

where Gt/l is a total conductance function normalized to a per-unit-length basis, Ga is an area conductance, and Gf is the fringe conductance function for the canonical interconnect structure.

19. The method according to claim 18, wherein the area conductance is calculated using the following equation:

$$Ga=(w)\times(Ca)\times(\tan \delta)$$

where Ca is an area capacitance calculated for the canonical interconnect structure, and tan δ is a loss tangent of dielectric between the conductive and the power/ground elements.

20. The method according to claim 6, wherein the at least one fringe RLGC coefficient is a fringe capacitance, and the information stored in the RLGC library is a fringe capacitance function that is dependent on a width of the canonical interconnect structure.

21. The method according to claim 1, wherein the electronic device is an integrated circuit.

22. The method according to claim 1, wherein the electronic device is an integrated circuit package.

23. The method according to claim 1, wherein the electronic device is a printed circuit structure adapted for mounting integrated circuit devices.

24. A method for designing an electronic device comprising:
   meshing an interconnect structure of the electronic device;
   computing one or more total capacitance, inductance, resistance, and conductance functions for each mesh of the interconnect structure using a field solver;
   computing corresponding ones of area capacitance, inductance, resistance, and conductance coefficients for each mesh polygon of the interconnect structure using parameter values associated with the interconnect structure;
   computing corresponding ones of fringe capacitance, inductance, resistance, and conductance coefficients for each edge mesh polygon of the interconnect structure using the one or more computed total capacitance, inductance, resistance, and conductance functions and the corresponding ones of the computed area capacitance, area inductance, area resistance, and area conductance coefficients;
   simulating the electronic device using the computed corresponding ones of the area capacitance, inductance, resistance, and conductance coefficients, and the corresponding ones of the fringe capacitance, inductance, resistance, and conductance coefficients to generate a simulation result; and
   outputting the simulation result.

* * * * *